United States Patent [19]

Lai et al.

[11] Patent Number: 5,722,848
[45] Date of Patent: Mar. 3, 1998

[54] RETENTION MECHANISM FOR SELF-SECUREMENT OF ZIF PGA SOCKET

[75] Inventors: Ching-ho Lai, Ta-Hsi Chen; Cheng-Hong Lin, Chung-Ho, both of Taiwan

[73] Assignee: Hon Hai Precision Ind. Co., Ltd., Taipei, Taiwan

[21] Appl. No.: 548,249

[22] Filed: Oct. 25, 1995

[51] Int. Cl.[6] .................................. H01R 13/620
[52] U.S. Cl. ............................................. 439/342
[58] Field of Search ...................... 439/259, 261–265, 439/267, 342

[56] References Cited

U.S. PATENT DOCUMENTS

| | | | |
|---|---|---|---|
| 4,648,669 | 3/1987 | Marks et al. | 439/342 |
| 5,425,652 | 6/1995 | Hsu | 439/342 |
| 5,443,591 | 8/1995 | Tsai | 439/342 |
| 5,489,217 | 2/1996 | Scheitz et al. | 439/342 |

Primary Examiner—Hien Vu

[57] ABSTRACT

A ZIF PGA socket (20) includes a base (22) having a plurality of passageways (24) extending vertically therethrough for receiving a corresponding number of contacts (26) therein, and a cover (28) having a corresponding number of holes (30) extending therethrough in alignment with the corresponding passageways (24) in the base (22) for allowing a corresponding number of pins extending from the PGA component. A lever (44) includes a cam shaft (48) embedded within a channel (50) formed adjacent the rear region of the socket (20) wherein cover (28) includes a retention device (54) and the base includes a restriction plane (64) to cooperate with the retention device (54) of the cover (28), and both of the retention device (54) and the restriction plane (64) are disposed adjacent the cam shaft (48) for efficiently fastening the cover (28) and the base (22) together to resist the larger resistance force occurring thereabout during the socket (20) in a closed state.

2 Claims, 8 Drawing Sheets

RETENTION MECHANISM FOR SELF-SECUREMENT OF ZIF PGA SOCKET

BACKGROUND OF THE INVENTION

1. Field of The Invention

The invention relates to ZIF PGA sockets, particularly to the structures around the cam shaft of the lever for efficiently retaining the cover in a restrained horizontal position with regard to the base.

2. The Prior Art

The CPUs are more and more popular in the computer industry. As well known, the CPU is commonly connected to the mother board through a ZIF (zero insertion force) PGA socket which is directly mountably soldered on the mother board. It is noted that the ZIF PGA socket generally includes a base securely mounted onto the mother board, and a cover slidably moved with regard to such base by means of lever means whereby the CPU or PGA may be loaded onto the socket in a ZIF status when the lever is in a vertical position and the socket is in an open state, and the conductive pins of the PGA can engage the corresponding contacts in the socket for operative signal transmission when the lever is in a horizontal position and the socket is in a close state.

Figure 1:
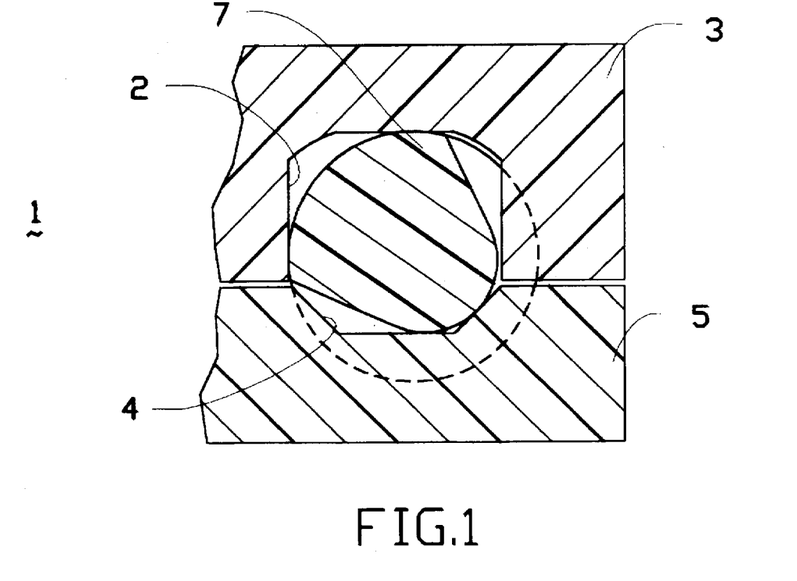
FIG. 1 is a partial cross-sectional view of a ZIF PGA socket disclosed in the copending patent application Ser. No. 08/217,606 to show the ideal relative positions between the base and the cover when the socket is in a closed state and mating with the corresponding PGA component thereon.

Recently, to increase the speed and the capacity of the signal transmission, the pin number of the CPU gets larger and larger. It is understood that the larger the pin number of the PGA is, the larger the resisting force is incurred during rotating the lever from the vertical position to the horizontal position. The significant resistance occurring between the cam shaft of the lever and the corresponding engagement bar of the cover may mislead the sliding movement of the cover with regard to the base. As shown in FIG. 1 which is generally of a ZIF PGA socket disclosed in U.S. patent application Ser. No. 08/217,606 filed Mar. 27, 1994 having a title "ZIF PGA SOCKET AND CONTACT THEREIN". This type socket 1 uses an upper half channel 2 formed in the cover 3 and a bottom half channel 4 formed in the base 5 wherein the upper channel 2 joins with the bottom channel 4 to form a full channel enclosing the cam shaft 7 therein. FIG. 1 discloses an ideally operative relationship between the cam shaft 7 of a lever and the cover 3 when the PGA has been loaded onto the socket 1 and the lever is rotated back to its original horizontal position for having the pins of the PGA and the contacts of the socket 1 engaged with each other. Nevertheless, the significant resistance force due to larger number of the pins/contacts of the PGA/socket, may result in lifting the cover 3 upward during the rotation of the lever process and eventually having the cover 3 staying in an oblique wrong position even though the lever has been rotated to its true horizontal position as shown in FIG. 1(A). Because the cover 3 can not reach its true position with regard to the base 5, the pins of PGA component extending through the cover holes substantially can not exactly and properly engage the corresponding contacts in the base 3 of the socket 1, thus resulting in poor mating. This poor mating between the pins of the PGA component and the corresponding contacts of the socket 1 may result in signal intermittence during vibration. Thus, to keep the cover 3 in the true position with regard to the base 5 after the PGA has been loaded onto the socket 1 and the pins of the PGA component are engaged with the corresponding contacts in the socket, is a very important key issue for the socket design, especially for a socket device having a large number of contacts therein.

The reason why the cover 3 may be lifted around the cam shaft 7, is that the cover 3 is retained onto the base 5 generally only by retaining means positioned on two sides of the base 5 and of the cover 3, referring to copending patent application Ser. No. 08/217,606. There is no sufficient or additional retention means of either the cover 3 or the base 5 to hook each other around the cam shaft 7 of the lever where the resistance and the confrontation of the cover 3 occur to the cam shaft 7. Therefore, to have the cover 3 and the base 5 own a reliable retention about the area adjacent to the cam shaft 7 is the object of the PGA socket, especially for what has a large number of contacts therein.

Figure 2:
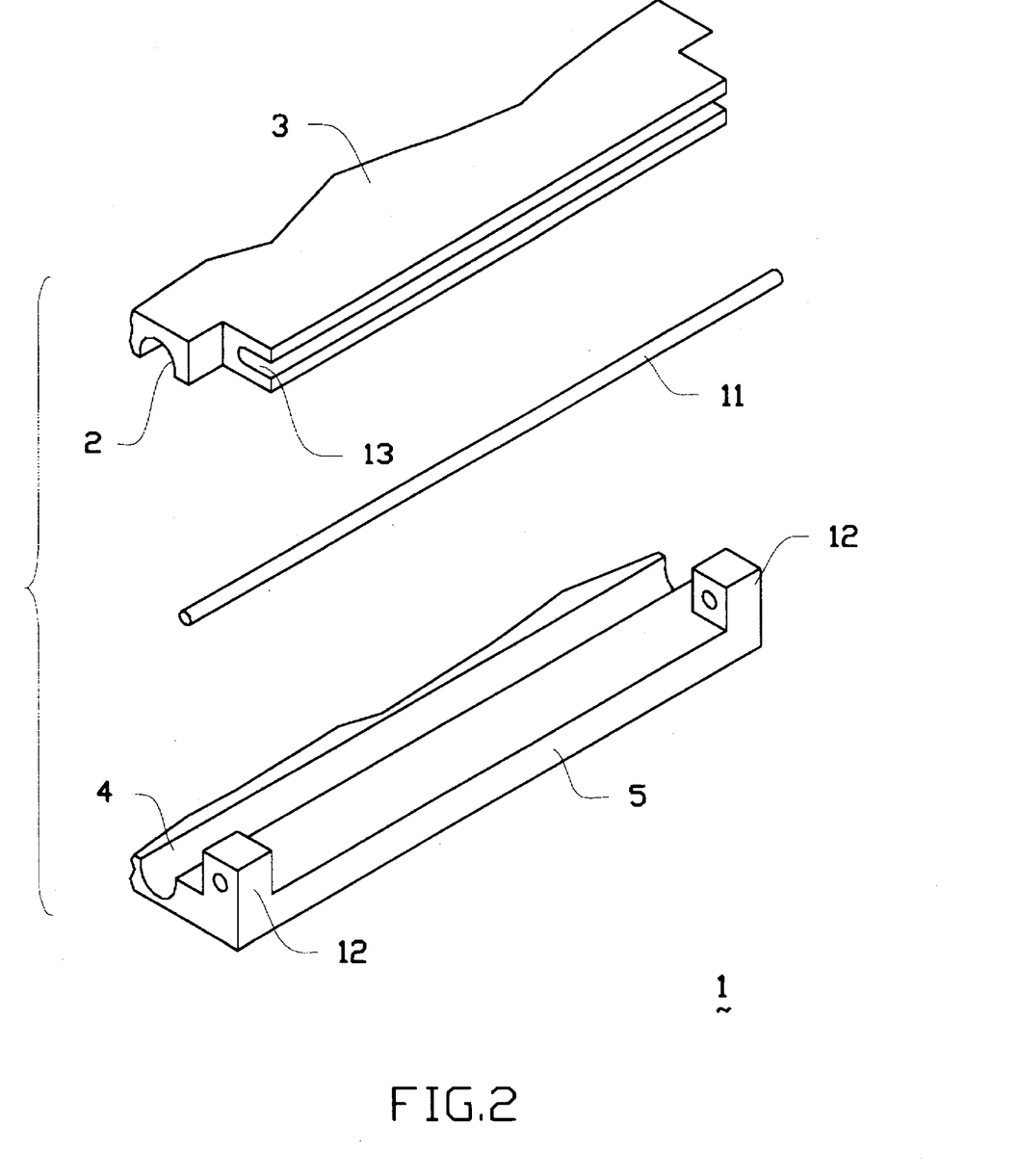
FIG. 2 is a fragmentary perspective view of the ZIF PGA socket of a first type prior art having retention mechanism for preventing the cover from improper lifting from the base.

As known, till now there are two type PGA sockets attempting to overcome the foregoing problem. As shown in FIG. 2, the first type is that an additional restraint bar 11 extends laterally and horizontally between two piers 12 extending rearward from the rear surface of the base 5, and the cover 3 forms a receiving slot 13 on the rear side for receiving such corresponding restraint bar 11 therein wherein the slot 13 comprises a sufficient depth for allowing the restraint bar 13 to move within the slot 13 in a front-to-end direction without leaving the slot 13, when the cover 3 is slidably moved in the front-to-end direction with regard to the base 5 during rotation of the lever. Accordingly, the engagement of the restraint bar 13, which is fixed to the base 5, with regard to the corresponding slot 13 in the cover 3, assures that the cover 3 will never be lifted with regard to the base 5. Even though this type PGA socket has good mechanism to avoid misplacing the cover 3 with regard to the base 5, the additional piers 12 and the restraint bar 11 of the base 5 and the slot portion 13 of the cover 3 may substantially increase the dimension of the whole socket 1 and complicate the manufacturing including assembling the socket 1 itself, thus resulting in its manufacturing and application shortcomings.

Figure 3:
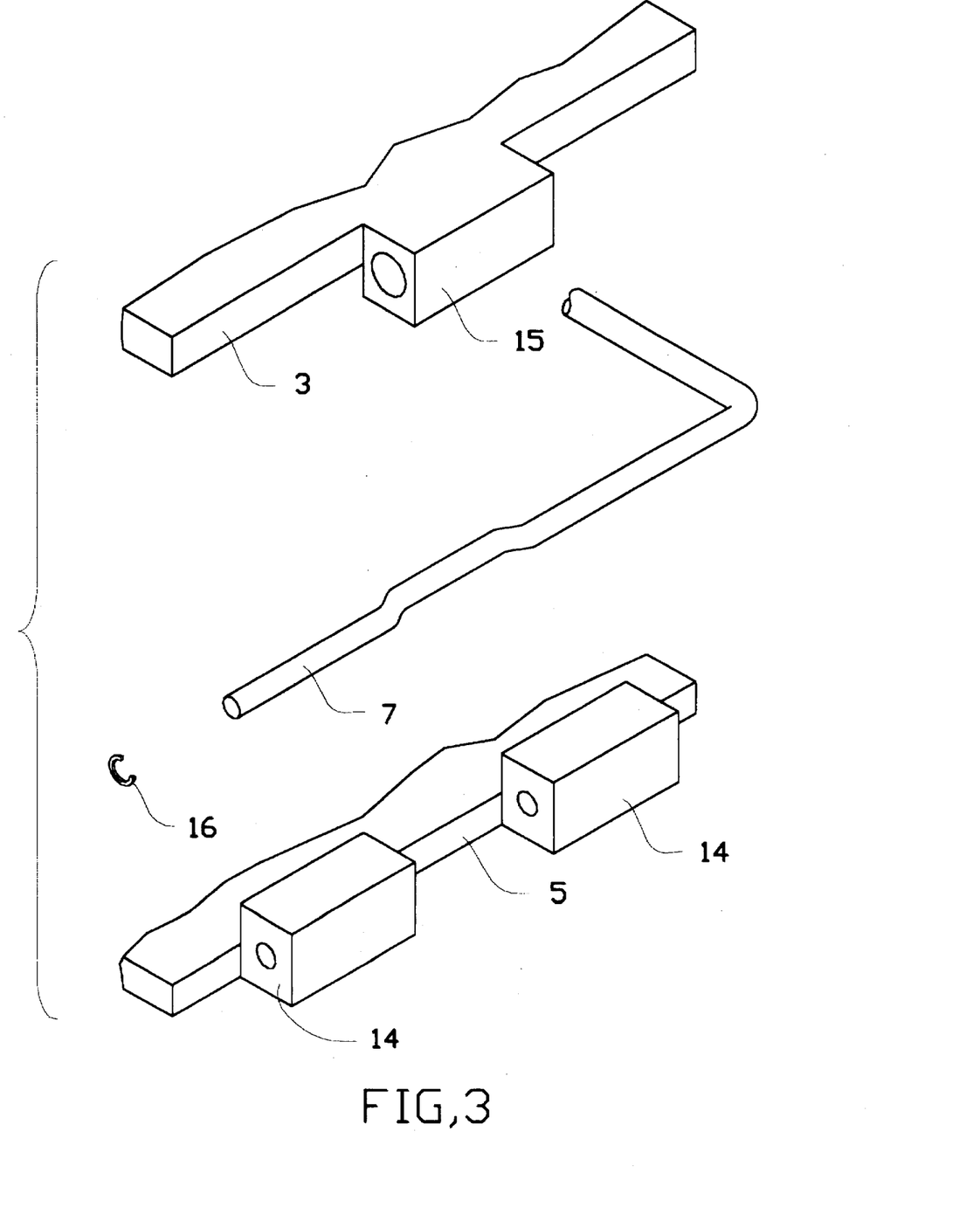
FIG. 3 is a fragmentary perspective view of the ZIF PGA socket of a second type prior art having retention mechanism for preventing the cover from improper lifting from the base.

There is a second type socket, as shown in FIG. 3 or referred to U.S. Pat. No. 4,836,798, which uses a basic hinge structure concept to implement the corresponding structure wherein the base 5 includes two sleeve barrels 14 formed on the base 5 and at least one sleeve barrels 15 formed on the cover 3 adapted to be assembled between and in alignment with such two sleeve barrels 14 of the base 5 via the cam shaft 7 extending through both of them. Based on this hinge structure, the cover 3 and the base 5 may not form any relative misplacement during rotation of the lever and/or sliding movement of the cover 3 with regard to the base 5.

The disadvantages of the second type socket include several matters. First, the sleeve barrels 14 and 15 only can be molded in injection molding by means of additional slide core mold components due to their openings being perpendicular to those of the passageways which receive the corresponding contacts therein, thus complicating manufacturing and increasing the cost. Secondly, during assembling the cam shaft 7 needs to first extend through one of the sleeve barrel 14 of the base 5 in a first horizontal direction, and then continuously extend through the sleeve barrel 15 of the cover 3 in a second little bit oblique direction because of its cam contour to avoid any improper obstruction during this insertion procedure, and lastly extend through the second sleeve barrel 14 of the base 5 back in a first horizontal direction. In other words, because the barrels 14 and 15 of the base 3 and of the cover 5 are substantially of a closed type themselves, it is really difficult to directly insert the cam shaft 7 into the barrels 14 and 15 without paying much attention or carefulness during assembling. Thirdly, generally an additional C-shaped ring 16 should be attached to the distal end of the cam shaft 7 for preventing such cam shaft 7 from being inadvertently laterally withdrawn from the corresponding barrels 14 and 15.

Therefore, an object of the invention is to provide a ZIF PGA socket having retention means directly formed on the base and on the cover for efficiently controlling the cover not to be lifted beyond the limit in the vertical direction during or after the sliding movement of the cover with regard to the base so that the cover associated with the corresponding pins extending from the PGA component, may correctly positioned with regard to the base when the socket is in a closed state and the contacts of the socket are substantially engaged with the corresponding pins of the PGA component. The retention means are easy to manufacture and be assembled with each other, and will not substantially increase the dimensions including the length, the width or the height of the original socket.

SUMMARY OF THE INVENTION

According to an aspect of the invention, a ZIF PGA socket includes a base having a plurality of passageways extending vertically therethrough for receiving a corresponding number of contacts therein, and a cover having a corresponding number of holes extending therethrough in alignment with the corresponding passageways in the base for allowing a corresponding number of pins extending from the PGA component. A lever includes a cam shaft embedded within a channel formed adjacent the rear region of the socket wherein cover includes a first retention device and the base includes a second retention device to cooperate with the first retention device of the cover, and both of the first and the second retention devices are disposed adjacent the cam shaft for efficiently fastening the cover and the base together to resist the larger resistance force occurring thereabout.

BRIEF DESCRIPTION OF THE DRAWINGS

FIG. 1(A) is a partial cross-sectional view of the ZIF PGA socket of FIG. 1 wherein the cover is substantially misplaced in a wrong position with regard to the base because of the larger resistance occurring between the cam shaft and the corresponding engaging portion of the cover.

FIG. 4(A) is a plan view of a contact for use in the socket.

FIG. 7(A) is a partially enlarged cross-sectional view of the assembled ZIF PGA socket of FIG. 1 to show the condition of the retention means when the socket is in an open state.

FIG. 8(A) is a partially enlarged cross-sectional view of the assembled ZIF PGA socket of FIG. 1 to show the condition of the retention means when the socket is in a closed state.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 4:
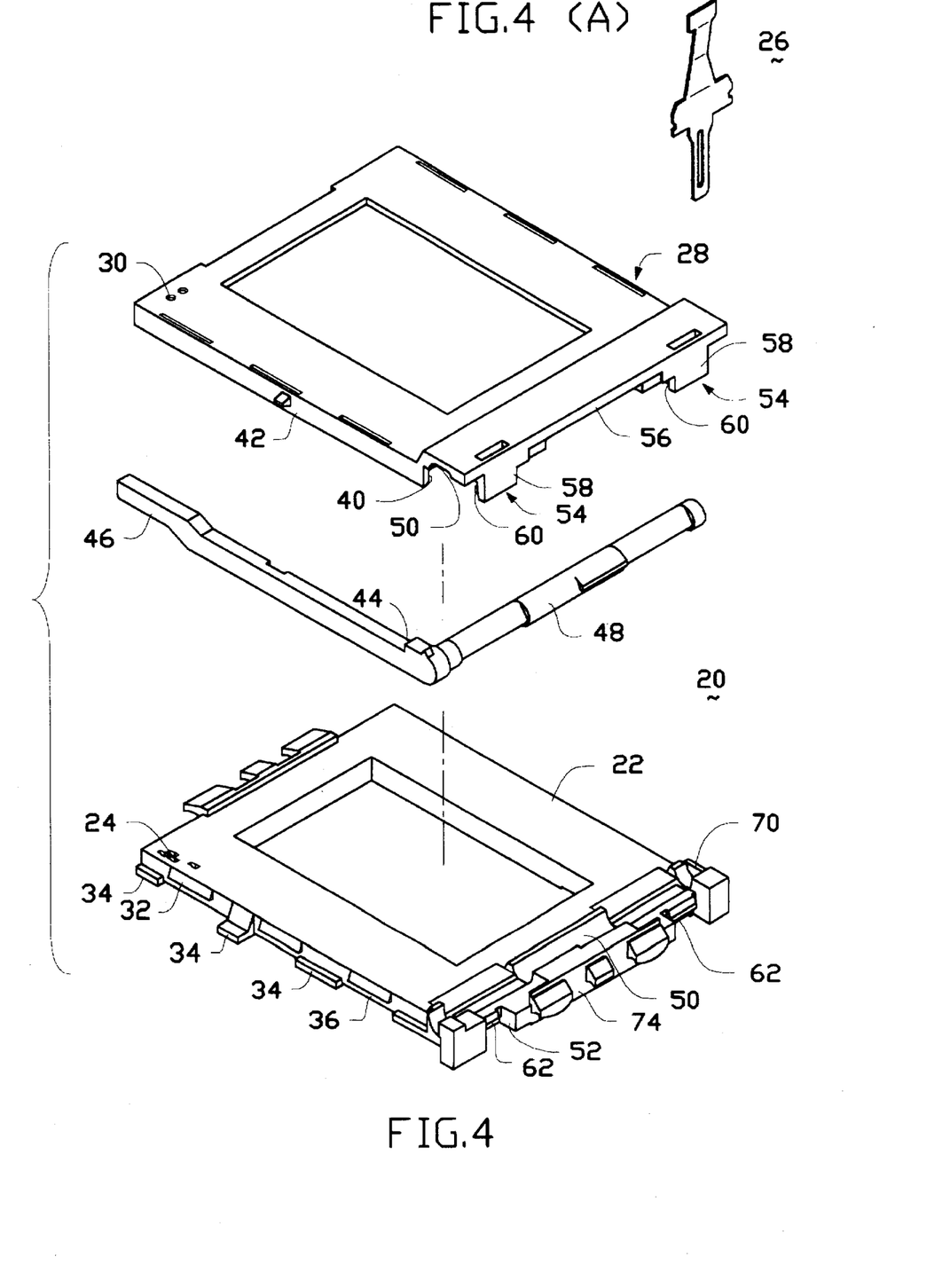
FIG. 4 is an exploded top perspective view of a presently preferred embodiment of a ZIF PGA socket according to the present invention.
Figure 5:
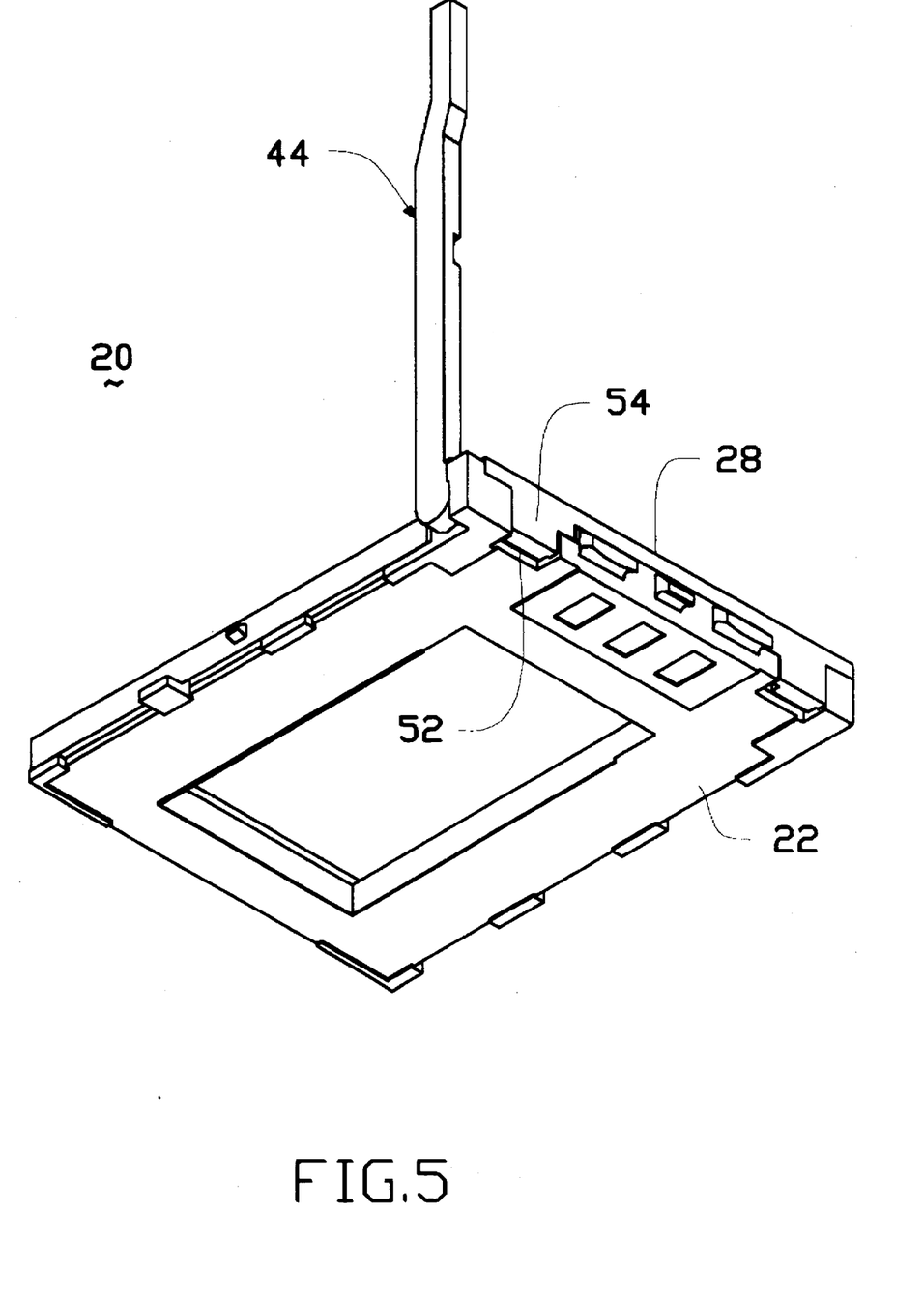
FIG. 5 is a bottom perspective view of an assembled ZIF PGA socket of FIG. 1 wherein the lever is in a vertical position.
Figure 6:
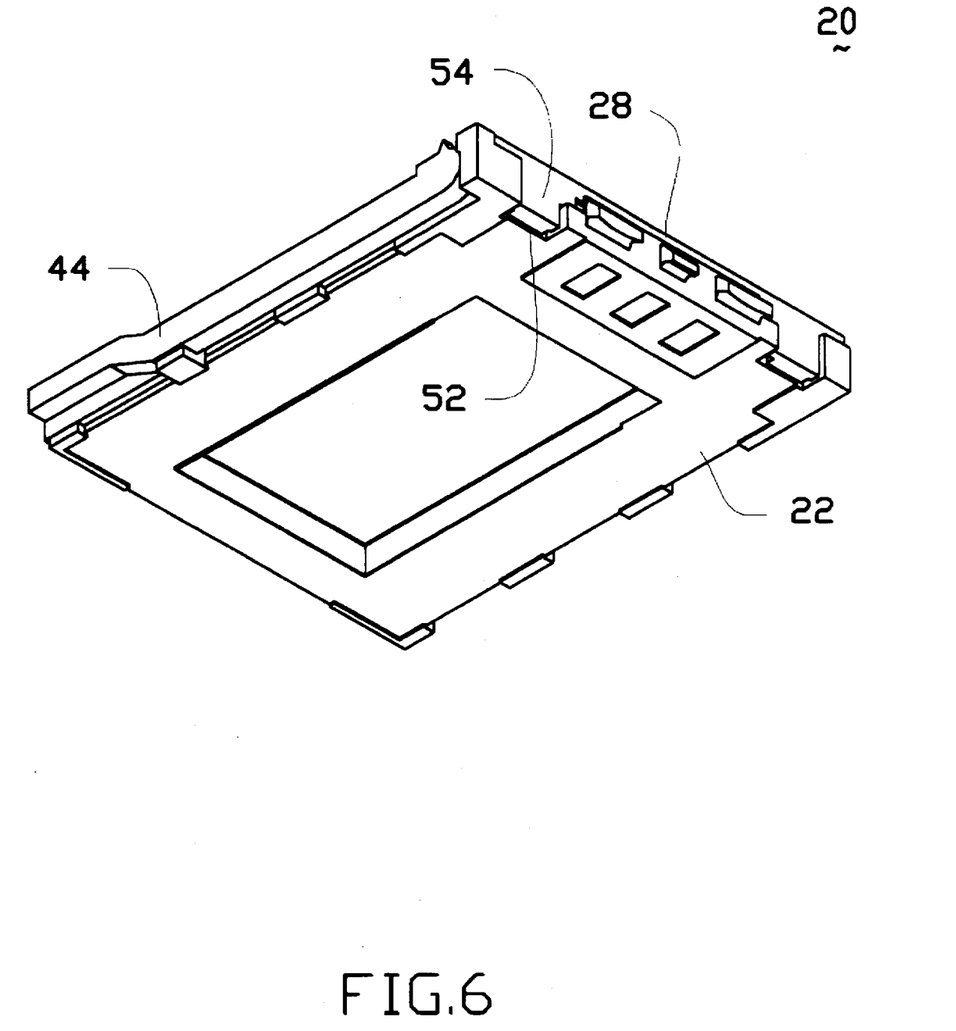
FIG. 6 is a bottom perspective view of the assembled ZIF PGA socket of FIG. 1 wherein the lever is in a horizontal position.

It will be noted here that for a better understanding, most of like components are designated by like reference numerals throughout the various figures in the embodiments. Attention is now directed to FIGS. 4–6 wherein a ZIF PGA socket 20 includes a base 22 having a plurality of passageways 24 (only few shown) extending vertically therethrough for receiving a corresponding number of contacts 26 (FIG. 4(A)) therein. A cover 28 having the similar contour with the base 22, includes a plurality of holes 30 (only few shown) extending vertically therethrough in alignment with the corresponding passageways 24, respectively, so that the pins which extend downward from the PGA component (not shown) may project downward through the corresponding holes 30 in the cover 28 and further into the corresponding passageways 24 in the base 22 for mechanically and electrically engagement with the corresponding contacts 26 therein. Similar to the existing sockets, the base 22 includes several upper protrusions 32 and several lower protrusions 34 on two side outer surfaces 36, and the cover 28 includes several protrusions (not shown) on its two side inner surfaces 40. The protrusions of the cover 28 cooperate with the upper protrusions 32 of the base 22 to fasten the cover 28 and the base 22 together in the vertical direction, and the bottom edges of two side walls 42 of the cover 28 may be seated on the lower protrusions 34 of the base 22. The similar basic retention mechanism between the cover 28 and the base 22 may be referred to copending patent application Ser. No. 08/217,606.

A lever 44 includes an actuation handle 46 and a cam shaft 48 wherein the handle 46 is positioned exposed beside one side wall 42 of the cover 28, and the cam shaft 48 is embedded within a channel generally formed by two half channels 50 respectively defined by the cover 28 and the base 22. The details of the channels 50 and the corresponding cam shaft 48 may be referred to the similar structures of the socket disclosed in aforementioned copending patent application Ser. No. 08/217,606.

The feature of the invention is that in comparison with the aforementioned copending patent application 08/217,606, the present invention further includes a pair of recesses 52 of generally L-shaped cross-section. Corresponding to each recess 52, the cover 28 further includes a L-shaped cross-sectional retention device 54 integrally extending downward from the rear wall 56 of the cover 28 for being adapted to be compactly positioned but slidably move within such recess 52. The retention device 54 includes a vertical aligning section 58 and a horizontal hook section 60 respectively embedded within the vertical portion and the horizontal portion of the corresponding recess 52 in the base 22. It can be noted that the base 22 forms a tapered surface 62 adjacent to the recess 52 for guidably having the retention device 54 of the cover 28 deflected outward a bit and to be received within the recess 52 when the cover 28 is assembled onto the base 22.

Figure 7:
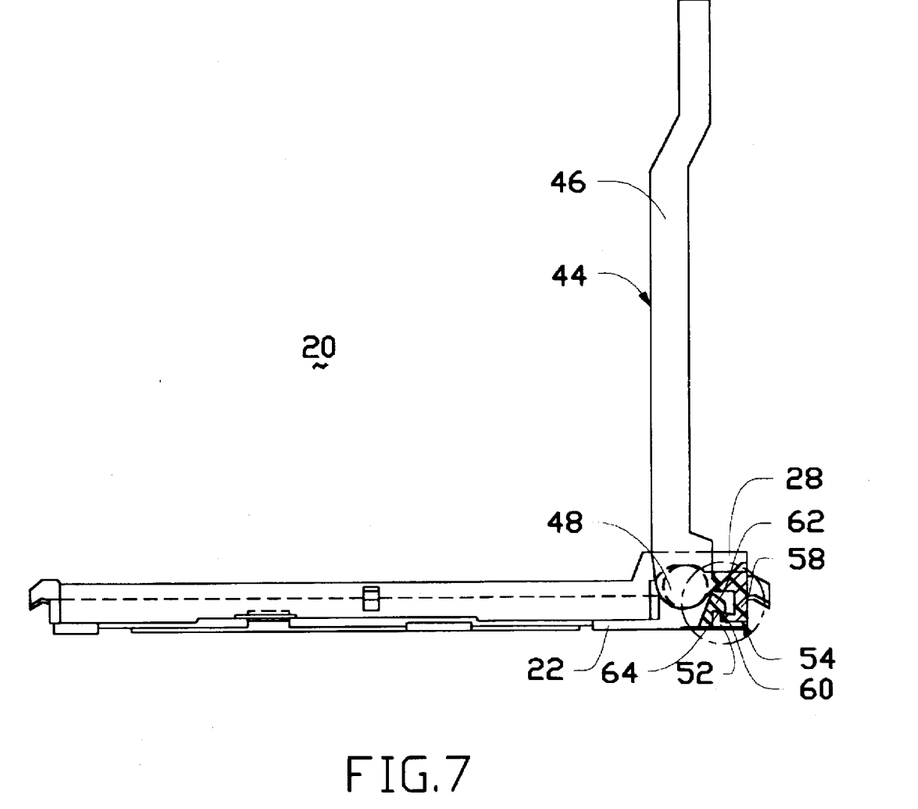
FIG. 7 is a side with partial cross-sectional view of the assembled ZIF PGA socket of FIG. 1 wherein the lever is in a vertical position and the socket is in an open state.

As shown in FIGS. 7 and 7(A), when the handle 46 of the lever 44 is rotated to its vertical position, the cover 28 is pushed to move to its rearward outermost position by cam shaft 48 of the lever 44 and the socket 20 may be deemed as being in an open state for being ready for zero insertion of the PGA component. Under this situation, the tip of the hook section 60 of the retention device 54 is positioned adjacent the edge of the corresponding restriction plane 64 beside the recess 52 but substantially still within the recess 52, thus assuring that the retention device 54 of the cover 28 is always disposed in the recess 52 without any possibility of withdrawal therefrom by any inadvertent external impact.

Figure 8:
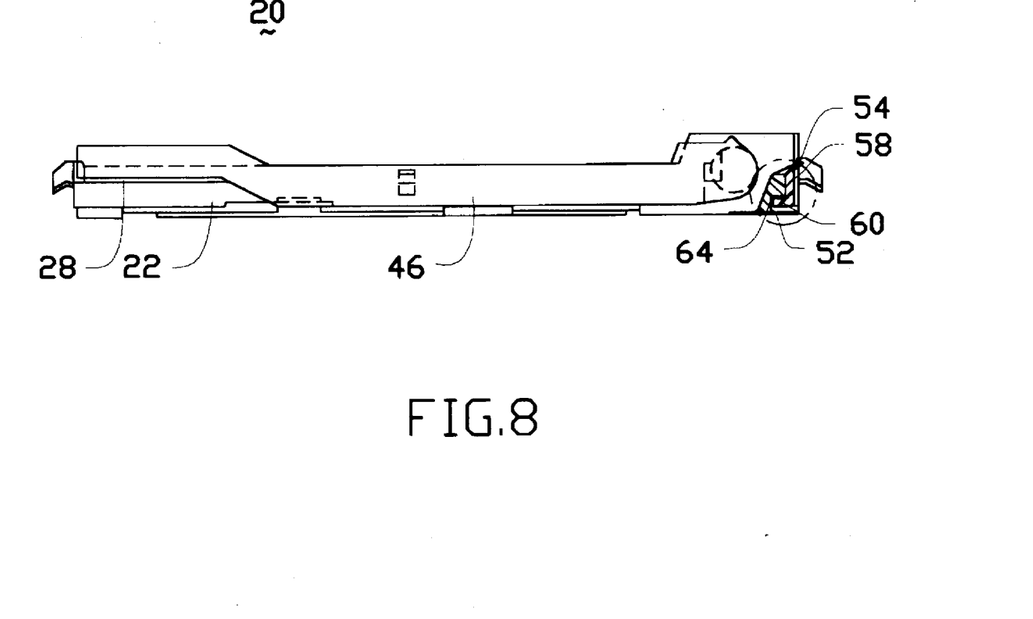
FIG. 8 is a side with partial cross-sectional view of the assembled ZIF PGA socket of FIG. 1 wherein the lever is in a horizontal position and the socket is in a closed state.

Further referring to FIGS. 8 and 8(A), when the PGA component (not shown) is loaded onto the cover 28 and the handle 46 of the lever 44 is rotated back to its original horizontal position, the cover 28 is pushed to move to forward outermost position and the socket 20 is in a closed state, thus the tip of the horizontal section 60 of the retention device 54 being in a deep place of the recess 52. It can be noted that under this situation, the horizontal hook section 60 of the retention device 54 substantially confronts the restriction plane 64 of the base 22 around the recess 52, so that the portion of the cover 28 around the cam shaft 48 can not be upwardly lifted to leave from the base 22. Because the cover 28 has no chance to bear any vertical misplacement, the cover 28 will be definitely moved back to its original forward outermost position by the cam shaft 48, and the pins of the PGA component can be correctly and designedly engaged with the corresponding contacts 26 positioned within the socket 20.

It can be seen that the hook section 60 of the retention device 54 and the corresponding restriction plane 64 of the base 22 are designedly arranged in a slope manner for strength enforcement consideration, there is a minor gap 100 existing therebetween when the cover 28 is moved to its forward outermost position. Even though this minor gap may allow the cover 28 is lifted to such a tiny extent, the cover 28 is still generally pushed back to its true position and such tiny floatation of the cover 28 will not influence the substantial engagement between the pins of the PGA component and the contacts 26 of the socket 20. Understandably, the restriction plane 64 and the retention device 54 can be alternatively arranged both in a horizontal manner, so that such gap 100 may be diminished to be a common clearance therebetween.

The advantage of the invention includes provision of retention means for assuring that the cover 28 has a true position with regard to the base 28 and thus the pins of the PGA component and the contacts 26 of the socket 20 are correctly and properly engaged with each other wherein such retention means is easily made and assembled, and does not require additional parts for manufacturing or assembling and the whole socket 20 may still keep in the dimension as the original one. It can be seen that the retention device 54 directly downward extending from the rear wall 56 of the cover 28 and the recess 52 is formed within the original contour defined by the rear wall 74 of the base 22. Thus, the present invention will not occupy additional space on the board on which the socket is mounted.

Another feature of the invention is that an end wall 70 is integrally formed at the end of the lower half channel for not only protecting the cam shaft inside but also enhancing the surrounding structure of channel.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A ZIF PGA socket comprising:

a base having a plurality of passageways extending vertically therethrough;

a corresponding number of contacts received within the passageways therein, respectively;

a cover slidably moved regard to the base and a number of holes extending therethrough in alignment with the corresponding passageways, respectively;

a lever including an actuation handle and a cam shaft joined with each other at an angle wherein the handle is exposed by one side of the socket for access and the cam shaft is embedded within a corresponding channel adjacent to a rear portion of the socket; and retention means integrally formed on said rear portion of the socket and beside said cam shaft of said lever, and said retention means including a retention device formed on one of said cover and base, and a recess formed in the other of said cover and base wherein said retention device includes a vertical alignment section for reception within said recess and a horizontal hook section for engagement with a restriction plane formed beside said recess;

whereby through said horizontal hook section securely confronted with the restriction plane, the cover can not substantially be lifted from the base, and wherein no additional parts are required to manufacture or assemble said cover and said base.

2. A ZIF PGA socket comprising:

a base having a plurality of passageways extending vertically therethrough;

a corresponding number of contacts received within the passageways therein, respectively;

a cover slidably moved regard to the base and a number of holes extending therethrough in alignment with the corresponding passageways, respectively;

a lever including an actuation handle and a cam shaft joined with each other at an angle wherein the handle is exposed by one side of the socket for access and the cam shaft is embedded within a corresponding channel adjacent to a rear portion of the socket; and retention means integrally formed on said rear portion of the socket and beside said cam shaft of said lever, and said retention means including a retention device formed on one of said cover and base and a recess formed in the other of said cover and base, wherein said retention device includes a vertical alignment section for reception within said recess and a horizontal hook section for engagement with a restriction plane formed beside said recess, and said hook section of the retention device and said restriction plane are both arranged in a slope manner;

whereby through said horizontal hook section securely confronted with the restriction plane, the cover can not substantially be lifted from the base, and wherein no additional parts are required to manufacture or assemble said cover and base.

\* \* \* \* \*